US006472357B2

(12) United States Patent
Takashima

(10) Patent No.: US 6,472,357 B2
(45) Date of Patent: Oct. 29, 2002

(54) ELECTRONIC PARTS CLEANING SOLUTION

(75) Inventor: Masayuki Takashima, Sodegaura (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/773,628

(22) Filed: Feb. 2, 2001

(65) Prior Publication Data

US 2002/0022582 A1 Feb. 21, 2002

(30) Foreign Application Priority Data

Feb. 4, 2000 (JP) ....................................... 2000-028126
Feb. 4, 2000 (JP) ....................................... 2000-028128
Feb. 4, 2000 (JP) ....................................... 2000-028129
Feb. 4, 2000 (JP) ....................................... 2000-028130
Oct. 31, 2000 (JP) ....................................... 2000-332642

(51) Int. Cl.[7] ......................... C11D 1/722; H01L 21/302
(52) U.S. Cl. ......................... 510/175; 510/176; 510/177; 510/178; 510/202; 134/1.3; 134/2; 134/38; 134/40; 134/41; 134/42
(58) Field of Search ............................... 134/1.3, 2, 38, 134/40, 41, 42; 510/175, 176, 177, 178, 202

(56) References Cited

U.S. PATENT DOCUMENTS 5,139,607 A 8/1992 Ward et al.
5,234,506 A * 8/1993 Winston et al.
5,264,046 A 11/1993 Winston et al.
5,456,760 A * 10/1995 Goehausen
5,780,406 A 7/1998 Honda et al.
5,814,588 A 9/1998 Cala et al.

* cited by examiner

*Primary Examiner*—Gregory E. Webb
(74) *Attorney, Agent, or Firm*—Birch, Stewart, Kolasch & Birch, LLP

(57) ABSTRACT

An electronic parts cleaning solution comprising a hydroxide, water, metal corrosion inhibitor, and at least one compound represented by the following general formula (I) or (II):

$$HO-((EO)x-(PO)y)z-H \quad (I)$$

wherein, EO represents an oxyethylene group, PO represents an oxypropylene group, x and y represent integers satisfying the relation: x/(x+y)=0.05 to 0.4, and z represents a positive integer, $$R-[((EO)x-(PO)y)z-H]m \quad (II)$$

wherein, EO, PO, x, y and z are the same as in the general formula (I), R represents a residual group obtained by removing a hydrogen atom on a hydroxyl group of alcohol or amine having a hydroxyl group, or a residual group obtained by removing a hydrogen atom on an amino group of amine, and m represents an integer of 1 or more.

11 Claims, No Drawings

ELECTRONIC PARTS CLEANING SOLUTION

TECHNICAL FIELD OF THE INVENTION

The present invention relates to an electronic parts cleaning solution. More particularly, the present invention relates to an electronic parts cleaning solution for washing the surface of a substrate of liquid crystal displays, integrated circuit devices and the like.

BACKGROUND OF THE INVENTION

In producing and fabricating electronic parts such as liquid crystal displays using a glass substrate, integrated circuit devices using a silicon substrate, and the like, a process for washing fine wastes and organic substances adhering on the surface of an electronic part are required. It is conventionally known that an aqueous solution of a hydroxide showing alkaline nature is effective as a cleaning solution used in such a process. Particularly, ammonium hydroxide, tetramethylammonium hydroxide and the like are widely used as a cleaning solution which does not contain an alkali metal such as sodium leading to malfunction of an electronic part.

However, in some electronic parts, a silicon part and a metal other than silicon are simultaneously exposed on at least one part of the surface. There is a problem that when the above-mentioned alkaline aqueous solution is used for washing such parts, silicon and the metal other than silicon are eroded.

SUMMARY OF THE INVENTION

An object of the present invention is to provide an electronic parts cleaning solution which washes and removes efficiently fine wastes and organic substances adhered on the surface of an electronic part while suppressing erosion of silicon and a metal other than silicon, in particular, to provide an electronic parts cleaning solution suitably used in a process for washing an electronic part in which silicon and a metal other than silicon are exposed on the surface thereof.

The present inventors have intensively studied to solve the above-mentioned problems, and have found that a cleaning solution containing a metal corrosion inhibitor and a specific ether compound can efficiently wash and remove fine wastes and organic substances adhered on the surface of an electronic part while suppressing erosion of silicon and a metal other than silicon, and consequently can suppress erosion on silicon and a metal other than silicon, and found that it can be suitably used particularly in a process for washing an electronic part having a surface on which both of them are exposed, and have completed the present invention.

Namely, the present invention relates to [1] an electronic parts cleaning solution comprising salt of a hydroxide, water, metal corrosion inhibitor, and at least one compound represented by the following general formula (I) or (II):

$$HO—((EO)x\text{-}(PO)y)z\text{-}H \qquad (I)$$

wherein, EO represents an oxyethylene group, PO represents an oxypropylene group, x and y represent integers satisfying the relation: x/(x+y)=0.05 to 0.4, and z represents a positive integer, $$R—[((EO)x\text{-}(PO)y)z\text{-}H]m \qquad (II)$$

wherein, EO, PO, x, y and z are the same as in the general formula (I), R represents a residual group obtained by removing a hydrogen atom on a hydroxyl group of alcohol or amine having a hydroxyl group, or a residual group obtained by removing a hydrogen atom on an amino group of amine, and m represents an integer of 1 or more.

Further, the present invention relates to [2] an electronic parts cleaning solution wherein the cleaning solution further contains a water-soluble organic compound in the cleaning solution of [1].

Also, the present invention relates to [3] an electronic parts cleaning solution comprising salt of a hydroxide, water, water-soluble organic compound, and at least one compound of the above-mentioned general formula (I) or (II).

DETAILED DESCRIPTION OF THE INVENTION

The present invention will be described in detail below.

The hydroxide in the present invention is a salt of inorganic hydroxide such as ammonium hydroxide, potassium hydroxide, sodium hydroxide or the like, or a salt of organic hydroxide such as tetramethylammonium hydroxide or the like, and from the standpoint of metal contamination on an electronic part, ammonium hydroxide or tetramethylammonium hydroxide is preferable.

The concentration of the hydroxide in a cleaning solution is preferably from 0.01 to 31% by weight, further preferably from 0.05 to 10% by weight, and particularly preferably from 0.1 to 5.0% by weight. When the concentration is too low, washing ability may be insufficient, on the other hand, when the concentration is too high, preparation of a cleaning solution may be difficult.

The metal corrosion inhibitor in the present invention may advantageously be an organic compound containing in the molecule at least one of nitrogen, oxygen, phosphorus and sulfur elements, and can be appropriately selected depending on the kind of metal exposed on a surface of electronic parts. For example, when the metal is tungsten, compounds having in the molecule at least one mercapto group can be used. More specifically, thioaceticacid, thiobenzoicacid, thioglycol, thioglycerol, cysteine and the like are listed.

Further, when the metal is tungsten, organic compounds containing at least two hydroxyl groups in the molecule, or organic compounds containing at least one hydroxyl group and carboxyl group in the molecule can be used. More specifically, catechol, resorcinol, hydroquinone, pyrogallol, gallic acid, tannic acid and the like are listed.

Further, when the metal is copper, aliphatic alcohol based compounds which are a compound containing at least one mercapto group in the molecule and in which two or more carbon atoms constitute the compound and a carbon to which a mercapto group is bonded and a carbon to which a hydroxyl group is bonded are adjacent and connected can be used. More specifically, thioglycol, thioglycerol and the like are listed.

Further, when the metal is copper, compounds containing at least one azole in the molecule can also be used. More specifically, benzotriazole, tolutriazole, 4-methylimidazole, 5-hydroxymethyl-4-methylimidazole, 3-aminotriazole and the like are listed.

Then concentration of the metal corrosion inhibitor contained in a cleaning solution is preferably 0.0001 to 5% by weight, further preferably 0.001 to 1% by weight. When the concentration is too low, an effect of suppressing corrosion of a metal can not be manifested sufficiently, and when the concentration is too high, the corrosion suppressing effect does not increase so much as compared with increase in the concentration, and rather a problem in solubility in a cleaning solution may occur.

In the compound of the general formula (I) and/or (II) in the present invention, the oxyethylene group is represented by $—CH_2—CH_2—O—$, and the oxypropylene group is represented by $—CH(CH_2)—CH_2—O—$ or $—CH_2—CH(CH_3)—O—$.

When the value of x/(x+y) is less than 0.5, solubility in preparation of a cleaning solution may become insufficient, and on the other hand, when over 0.4, defoaming ability of the solution may become insufficient.

Here, the compound of —((EO)x-(PO)y)z- in the general formula (I) and (II) may be a block copolymer or random copolymer, or also a random copolymer revealing blocking property, and among them, a block copolymer is preferable.

As the alcohols constituting the above-mentioned R, there are listed monohydric alcohols such as 2-ethylhexyl alcohol, lauryl alcohol, cetyl alcohol, oleyl alcohol, tridecyl alcohol, oleyl alcohol, beef tallow alcohol, coconut oil alcohol and the like, ethylene glycol, propylene glycol, 1,3-propanediol, 1,2-butanediol, 1,3-butanediol, 2,3-butanediol, 1,4-butanediol, 2-methyl-1,2-propanediol, 2-methyl-1,3-propanediol, glycerine, trimethylolethane, trimethylolpropane, pentaerythritol, sorbitol, ethylenediamine, propylenediamine and the like.

The average molecular weight of the total amount of oxypropylene groups in a compound of the above-mentioned general formula (I) and/or (II) is 500 to 5000.

When the average molecular weight is too small, the washing ability may become insufficient, and on the other hand, when the average molecular weight is too large, the solubility in preparation may become insufficient.

The weight ratio of a compound of the general formula (I) and/or (II) to the hydroxide is preferably from $0.3\times10^{-4}$ to 1.

When the proportion of the copolymer is too small, erosion amount on silicon may increase, and on the other hand, when the proportion of the copolymer is too large, the defoaming ability may become insufficient.

As specific product names of compounds of the general formula (I) and/or (II), ADEKA PLURONIC L31, L61, L44, L64, L68, TR701, TR702, TR704, TR504, TR304 (manufactured by Asahi Denka Kogyo K. K., hereinafter abbreviated as ADEKA L31, L61, L44, L64, L68, TR701, TR702, TR704, TR504, TR304), LEOCON 1015H, 1020H (manufactured by Lion Corp.), EPAN 410, 420, 610, 710, 720 (manufactured by Dai-ichi Kogyo Seiyaku Co., Ltd.), and the like are listed.

By adding a compound of the general formula (I) and/or (II), erosion of a metal in an electronic part, particularly of silicon can be prevented, and by adding a metal corrosion inhibitor, erosion of a metal in an electronic part, particularly of tungsten and copper a metal other than silicon can be prevented, however, when these compounds are added in high concentration, or when a hydroxide is added in a high concentration, a cleaning solution may be opacified.

In an electronic parts cleaning solution, fine particle in the solution is generally removed by precision filtration, and the number of particles in the solution is controlled by the amount and strength of irregular reflection occurred due to the presence of particle when the solution is irradiated with a laser beam. Therefore, when the solution is opacified, fine particles in the solution cannot be distinguished, meaning a problem.

In the present invention, by addition of a water-soluble organic compound to a cleaning solution, opacification can be prevented.

As the water-soluble organic compound, at least one of compounds including alcohols, ketones, aliphatic acids, esters, phenols and the like is listed, and more specific examples thereof include methanol, ethanol, 1-propanol, 2-propanol, 1-butanol, 2-butanol, ethylene glycol, isobutyl alcohol, tert-butyl alcohol, acetone, methyl ethyl ketone, 2-pentanone, 3-pentanone, methyl formate, ethyl formate, propyl formate, methyl acetate, ethyl acetate, triethyl phosphate, phenol, o-cresol, p-cresol, m-cresol and the like.

Among them, from the standpoint of solubility in water, methanol, ethanol, 1-propanol, 2-propanol, ethylene glycol, acetone and the like are preferable.

The concentration of the water-soluble organic compound in a cleaning solution is preferably 0.01 to 60% by weight, further preferably 0.05 to 50% by weight, and particularly preferably 0.5 to 40% by weight. When the concentration is too low, the solution may be opacified if the concentration of an alkali compound is high or if a compound suppressing erosion of silicon is added in high concentration, on the other hand, even when the concentration is increased over the upper limit, an effect of solving opacification is not improved so much.

A cleaning solution of the present invention can be obtained by mixing a hydroxide, water, metal corrosion inhibitor, and at least one compound of the general formula (I) or (II) in given amounts, by mixing a hydroxide, water, metal corrosion inhibitor, water-soluble organic compound and at least one compound of the general formula (I) or (II) in given amounts, or by mixing a hydroxide, water, water-soluble organic compound and at least one compound of the general formula (I) or (II) in given amounts. Further, other components may be added, if necessary, to these cleaning solutions.

The mixing method is not particularly restricted, and various known methods can be adapted.

For washing an electronic part using a cleaning solution of the present invention, an electronic part may be advantageously be washed by using a cleaning solution of the present invention, for example, at temperatures in the range from 10 to 80° C.

Alternatively, a cleaning solution of the present invention may also be mixed with hydrogen peroxide and the like before washing an electronic part.

An electronic parts cleaning solution of the present invention is excellent in washing effect, and suppresses erosion property on silicon such as single crystalline silicon, amorphous silicon, polycrystalline silicon and the like, and metals other than silicon, for example, metals such as tungsten and copper, and can be suitably used in a process for washing an electronic part such as liquid crystal displays, integrated circuit devices using a silicon substrate, and the like.

An electronic parts cleaning solution of the present invention can efficiently wash and remove fine wastes and organic substances adhered on the surface of an electronic part, and can suppress erosion on silicon and a metal other than silicon. An electronic parts cleaning solution of the present invention can be suitably used particularly in a process for washing an electronic part having a surface on which both of silicon and a metal other than silicon are exposed.

EXAMPLE

The following examples will illustrate the present invention further in detail below, but do not limit the scope of the present invention.

Examples 1 and 2 and Comparative Example 1

(A) a test piece obtained by forming a 1000 Å silicon dioxide film on a silicon substrate and then forming a 1000 Å amorphous silicon film thereon, and (B) a test piece obtained by forming a 1000 Å silicon nitride film on a silicon substrate and then forming a 1000 Å tungsten film thereon, were used as a material to be washed. These test pieces were immersed in cleaning solutions described in Table 1 kept at 50° C. in a constant temperature bath, and erosion property of the cleaning solutions on amorphous silicon and tungsten was measured. The conditions and results are shown in Table 1.

TABLE 1

| Solution composition | | | Erosion rate of (A) (Å/min.) | Erosion rate of (B) (Å/min.) |
|---|---|---|---|---|
| Example 1 | Ammonium hydroxide | 0.3% by weight | 0.6 | 2.1 |
| | ADEKA TR704* | 50 ppm | | |
| | Cysteine | 0.5% by weight | | |
| Example 2 | Ammonium hydroxide | 0.3% by weight | 0.4 | 0.3 |
| | ADEKA TR704* | 50 ppm | | |
| | Thioglycerol | 0.2% by weight | | |
| Comparative example 1 | Ammonium hydroxide | 0.3% by weight | 0.4 | 5.2 |
| | ADEKA TR704* | 50 ppm | | |

*ADEKA TR704: Compound of the general formula (II) of the present invention in which the average molecular weight of oxypropylene groups is 2501 to 3000, x/(x + y) = 0.4, and R is ethylenediamine.

Example 3 and Comparative Example 2

(A) a test piece obtained by forming a 1000 Å silicon dioxide film on a silicon substrate and then forming a 1000 Å amorphous silicon film thereon, and (C) a test piece obtained by forming a 1000 Å copper film on a silicon substrate, were used as a material to be washed. These test pieces were immersed in cleaning solutions described in Table 2 kept at 50° C. in a constant temperature bath, and erosion property of the cleaning solutions on amorphous silicon and copper was measured. The conditions and results are shown in Table 2.

TABLE 2

| Solution composition | | | Erosion rate of (A) (Å/min.) | Erosion rate of (C) (Å/min.) |
|---|---|---|---|---|
| Example 3 | Ammonium hydroxide | 0.3% by weight | 0.6 | 3.1 |
| | ADEKA TR704 | 50 ppm | | |
| | Thioglycerol | 0.2% by weight | | |
| Example 3 | Ammonium hydroxide | 0.3% by weight | 0.4 | 1.0 |
| | ADEKA TR704 | 50 ppm | | |
| | Benzotriazole | 0.2% by weight | | |
| Comparative example 2 | Ammonium hydroxide | 0.3% by weight | 0.4 | 13.0 |
| | ADEKA TR704 | 50 ppm | | |

Examples 4 and 5 and Comparative Example 3

(A) a test piece obtained by forming a 1000 Å silicon dioxide film on a silicon substrate and then forming a 1000 Å amorphous silicon film thereon, and (B) a test piece obtained by forming a 1000 Å silicon nitride film on a silicon substrate and then forming a 1000 Å tungsten film thereon, were used as a material to be washed. These test pieces were immersed in cleaning solutions described in Table 3 kept at 50° C. in a constant temperature bath, and erosion property of the cleaning solutions on a morphous silicon and tungsten was measured. The conditions and results are shown in Table 3.

TABLE 3

| Solution composition | | | Erosion rate of (A) (Å/min.) | Erosion rate of (B) (Å/min.) | Occurrence of opacification |
|---|---|---|---|---|---|
| Example 4 | Ammonium hydroxide | 0.3% by weight | 0.4 | 1.2 | Not occurred |
| | ADEKA TR702* | 10 ppm | | | |
| | Cysteine | 0.5% by weight | | | |
| | Isopropyl alcohol | 0.6% by weight | | | |
| Example 5 | Ammonium hydroxide | 0.3% by weight | 0.6 | 0.5 | Not occurred |
| | ADEKA TR702* | 10 ppm | | | |
| | Thioglycol | 0.2% by weight | | | |
| | Isopropyl alcohol | 0.6% by weight | | | |
| Comparative example 3 | Ammonium hydroxide | 0.3% by weight | 0.3 | 5.5 | Occurred |
| | ADEKA TR702* | 10 ppm | | | |

*ADEKA TR702: Compound of the general formula (II) of the present invention in which the average molecular weight of oxypropylene groups is 2501 to 3000, x/(x + y) = 0.2, and R is ethylenediamine.

Examples 6 and 7 and Comparative Examples 4 and 5

A test piece obtained by forming a 1000 Å silicon dioxide film on a silicon substrate and then forming a 1000 Å amorphous silicon film thereon was used as a material to be washed. This test piece was immersed in cleaning solutions described in Table 4 kept at 50° C. in a constant temperature bath, and erosion property of the cleaning solutions on amorphous silicon was measured. Further, the degree of opacification of the cleaning solutions was observed visually. The conditions and results are shown in Table 4.

TABLE 4

| Solution composition | | | Occurrence of opacification | Erosion rate of amorphous silicon (Å/min.) |
|---|---|---|---|---|
| Example 6 | Ammonium hydroxide | 0.3% by weight | Not occurred | 1.8 |
| | ADEKA L61* | 10 ppm | | |
| | Isopropyl alcohol | 0.6% by weight | | |
| Comparative example 4 | Ammonium hydroxide | 0.3% by weight | Occurred | 1.2 |
| | ADEKA L61* | 10 ppm | | |
| Example 7 | Ammonium hydroxide | 0.3% by weight | Not occurred | 1.2 |
| | ADEKA TR702 | 10 ppm | | |
| | Isopropyl alcohol | 0.6% by weight | | |

TABLE 4-continued

| | Solution composition | | Occurrence of opacification | Erosion rate of amorphous silicon (Å/min.) |
|---|---|---|---|---|
| Comparative example 5 | Ammonium hydroxide | 0.3% by weight | Occurred | 1.6 |
| | ADEKA TR702 | 10 ppm | | |

*ADEKA L61: Compound of the general formula (I) of the present invention in which the average molecular weight of oxypropylene groups is 1750, and x/(x + y) = 0.1.

Example 8 and Comparative Example 6

Cleaning solutions described in Table 5 were prepared, and the degree of opacification was measured by an integrating sphere turbidimeter. The results are shown in Table 5 likewise.

TABLE 5

| | Solution composition | | Turbidity |
|---|---|---|---|
| Example 8 | Ammonium hydroxide | 15% by weight | 0.5 degree |
| | Isopropyl alcohol | 30% by weight | |
| | ADEKA TR702 | 500 ppm | |
| Comparative example 6 | Ammonium hydroxide | 15% by weight | 720 degree |
| | ADEKA TR702 | 500 ppm | |

What is claimed is:

1. An electronic parts cleaning solution comprising a hydroxide, water, a metal corrosion inhibitor, and at least one compound represented by the following general formula (I) or (II):

$$HO—((EO)x\text{-}(PO)y)z\text{-}H \quad (I)$$

wherein, EO represents an oxyethylene group, PO represents an oxypropylene group, x and y represent integers satisfying the relation: x/(x+y)=0.05 to 0.4, and z represents a positive integer, $$R—[((EO)x\text{-}(PO)y)z\text{-}H]m \quad (II)$$

wherein, EO, PO, x, y and z are the same as in the general formula (I), R represents a residual group obtained by removing a hydrogen atom on a hydroxyl group of alcohol or amine having a hydroxyl group, or a residual group obtained by removing a hydrogen atom on an amino group of amine, and m represents an integer of 1 or more; and provided that:

the metal corrosion inhibitor is a tungsten corrosion inhibitor and comprises at least one selected from the group consisting of compounds containing at least one mercapto group in the molecule, organic compounds containing at least two hydroxyl groups in the molecule, and organic compounds containing at least one hydroxyl group and carboxyl group in the molecule, or the metal corrosion inhibitor is a copper corrosion inhibitor and comprises an aliphatic alcohol based compound which is a compound containing at least one mercapto group in the molecule and in which two or more carbon atoms constitute the compound and a carbon to which a mercapto group is bonded and a carbon to which a hydroxyl group is bonded are adjacent and connected.

2. The electronic parts cleaning solution according to claim 1, wherein the cleaning solution further contains a water-soluble organic compound.

3. The electronic parts cleaning solution according to claim 1, wherein the hydroxide is at least one selected from the group consisting of ammonium hydroxide, tetramethylammonium hydroxide, potassium hydroxide and sodium hydroxide.

4. The electronic parts cleaning solution according to claim 1, wherein the concentration of the hydroxide is 0.01 to 31% by weight.

5. The electronic parts cleaning solution according to claim 1, wherein the weight ratio of at least one compound represented by the general formula (I) or (II) to the hydroxide is from $0.3\times10^{-4}$ to 1.

6. The electronic parts cleaning solution according to claim 1, wherein the metal corrosion inhibitor comprises an organic compound containing in the molecule at least one selected from the group consisting of nitrogen, oxygen, phosphorus and sulfur.

7. The electronic parts cleaning solution according to claim 1, wherein the metal corrosion inhibitor is a copper corrosion inhibitor and comprises a compound containing at least one azole in the molecule.

8. The electronic parts cleaning solution according to claim 1, wherein the concentration of the metal corrosion inhibitor is 0.0001 to 5% by weight.

9. The electronic parts cleaning solution according to claim 1, wherein the pH of the cleaning solution is 8 or more.

10. The electronic parts cleaning solution according to claim 2, wherein the water-soluble organic compound is at least one selected from the group consisting of alcohols, ketones, esters and phenols.

11. The electronic parts cleaning solution according to claim 2, wherein the concentration of the water-soluble organic compound is 0.01 to 50% by weight.

* * * * *